(12) United States Patent
Sun et al.

(10) Patent No.: US 10,983,428 B2
(45) Date of Patent: Apr. 20, 2021

(54) MASK AND METHOD OF FORMING PATTERN

(71) Applicant: UNITED MICROELECTRONICS CORP., Hsin-Chu (TW)

(72) Inventors: Chia-Chen Sun, Kaohsiung (TW); Yu-Cheng Tung, Kaohsiung (TW); Sheng-Yuan Hsueh, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 205 days.

(21) Appl. No.: 15/978,215

(22) Filed: May 14, 2018

(65) Prior Publication Data

US 2019/0317393 A1 Oct. 17, 2019

(30) Foreign Application Priority Data

Apr. 12, 2018 (TW) .................................. 107112549

(51) Int. Cl.
*G06F 30/39* (2020.01)
*G03F 1/36* (2012.01)

(52) U.S. Cl.
CPC ................ *G03F 1/36* (2013.01); *G06F 30/39* (2020.01)

(58) Field of Classification Search
CPC ........................................................ G03F 1/36
USPC ........................................................... 716/50
See application file for complete search history.

(56) References Cited

U.S. PATENT DOCUMENTS

| | | | |
|---|---|---|---|
| 6,818,480 B2 | 11/2004 | Lee | |
| 7,682,757 B2 | 3/2010 | Mashita | |
| 8,962,221 B2 | 2/2015 | Yang | |
| 2005/0003305 A1* | 1/2005 | Hashimoto | G03F 1/30 430/311 |
| 2006/0141369 A1* | 6/2006 | Ito | G03F 1/36 430/5 |
| 2008/0113280 A1* | 5/2008 | Osawa | G03F 1/36 430/5 |
| 2009/0091736 A1* | 4/2009 | Yamazoe | G03F 7/70058 355/77 |
| 2010/0021825 A1* | 1/2010 | Kodama | G03F 1/36 430/5 |
| 2011/0188734 A1* | 8/2011 | Tsuchiya | G06T 7/0002 382/149 |
| 2013/0302724 A1* | 11/2013 | Yang | G03F 1/36 430/5 |
| 2015/0153641 A1* | 6/2015 | Nakayama | G03F 1/36 716/55 |
| 2015/0227040 A1* | 8/2015 | Ha | G03F 1/50 430/5 |
| 2015/0316841 A1* | 11/2015 | Misaka | G03F 1/32 430/5 |
| 2016/0195803 A1* | 7/2016 | Adachi | G03F 7/32 430/5 |

* cited by examiner

*Primary Examiner* — Suchin Parihar
(74) *Attorney, Agent, or Firm* — Winston Hsu

(57) ABSTRACT

A mask includes a substrate, a main pattern, a first assist pattern, and a second assist pattern. The main pattern is disposed on the substrate. The main pattern includes a first pattern and second patterns. Two of the second patterns are disposed at two opposite sides of the first pattern in a first direction. The first assist pattern is disposed on the substrate and disposed in the main pattern. The second assist pattern is disposed on the substrate and disposed outside the main pattern. The first assist pattern disposed in the main pattern may be used to improve the pattern transferring performance in a photolithography process using the mask.

16 Claims, 11 Drawing Sheets

MASK AND METHOD OF FORMING PATTERN

BACKGROUND OF THE INVENTION

1. Field of the Invention

The present invention relates to a mask and a method of forming a pattern, and more particularly, to a mask including an assist pattern and a method of forming a pattern by using the mask.

2. Description of the Prior Art

With the trend of miniaturization of the electronic products and peripherals, research about thin structures and high integration of the semiconductor devices have become the essential subjects and developing aspects in the industry, and the lithography technology plays an important role to determine the performances of the semiconductor devices.

In semiconductor manufacturing processes, the integrated circuit layout is first designed and formed as a mask pattern on a mask. The mask pattern is then proportionally transferred to a photoresist layer disposed on a semiconductor substrate through processes such as an exposure process followed by a development process. Subsequently, a corresponding etching process is performed in order to manufacture the semiconductor devices on the semiconductor substrate. With the demand of increasing integration of semiconductor devices, the design rule of line width and space between lines or devices becomes finer. However, due to the optical proximity effect (OPE), the width and the space are subject to optical limitations. For example, when the patterns are arranged with higher density, the center pattern surrounded by the peripheral patterns tends to be influenced by light diffraction and interference in the exposure process and cannot be effectively transferred to the photoresist layer, and the manufacturing yield loss may increase accordingly.

SUMMARY OF THE INVENTION

A mask and a method of forming a pattern are provided in the present invention. A first assist pattern is disposed in a main pattern for improving the pattern transferring performance in an exposure process.

According to an embodiment of the present invention, a mask is provided. The mask includes a substrate, a main pattern, a first assist pattern, and a second assist pattern. The main pattern is disposed on the substrate, and the main pattern includes a first pattern and second patterns. Two of the second patterns are disposed at two opposite sides of the first pattern in a first direction. The first assist pattern is disposed on the substrate and disposed in the main pattern. The second assist pattern is disposed on the substrate and disposed outside the main pattern.

According to an embodiment of the present invention, a method of forming a pattern is provided. The method includes the following steps. A layout pattern is provided to a computer system. The layout pattern includes a first pattern and second patterns, and two of the second patterns are disposed at two opposite sides of the first pattern in a first direction. A first assist pattern is formed in the layout pattern. A second assist pattern is formed outside the layout pattern. The layout pattern, the first assist pattern, and the second assist pattern are outputted through the computer system onto a mask. The first assist pattern is located in the layout pattern, and the second assist pattern is located outside the layout pattern.

According to another embodiment of the present invention, a mask is provided. The mask includes a substrate, a main pattern, and an assist pattern. The main pattern is disposed on the substrate, and the main pattern includes a first pattern and second patterns. The first pattern and the second patterns are arranged in an array configuration, and the second patterns surround the first pattern. The assist pattern is disposed on the substrate. The assist pattern includes sub patterns disposed in the first pattern or disposed in the second patterns.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
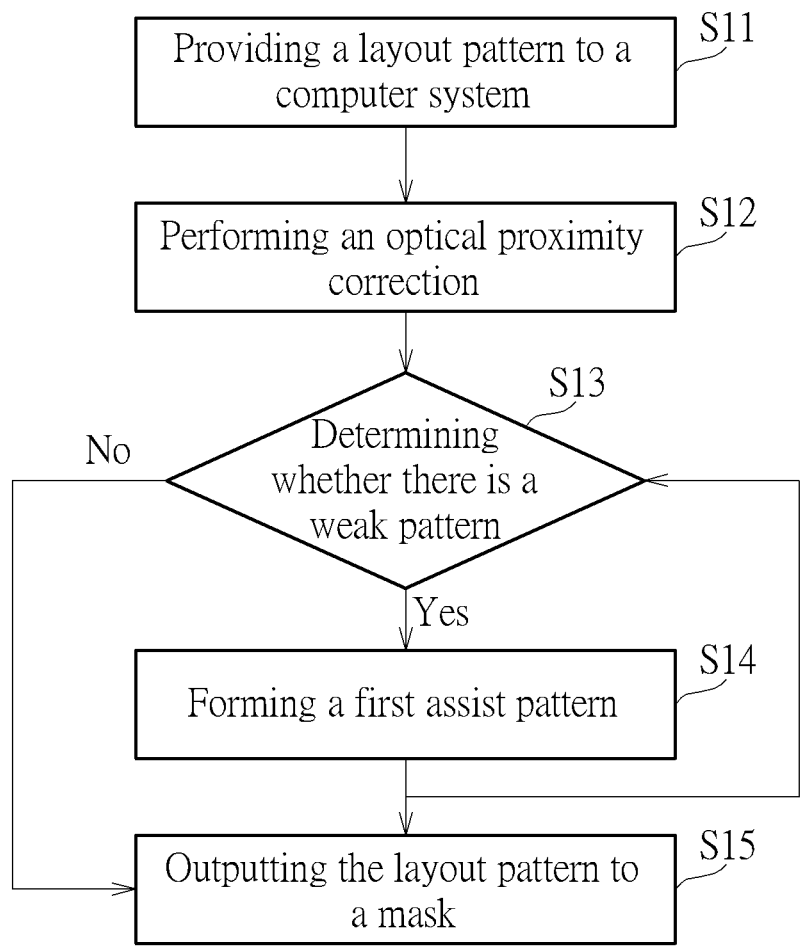
FIG. 1 is a flow chart of a method of forming a pattern according to a first embodiment of the present invention.
Figure 2:
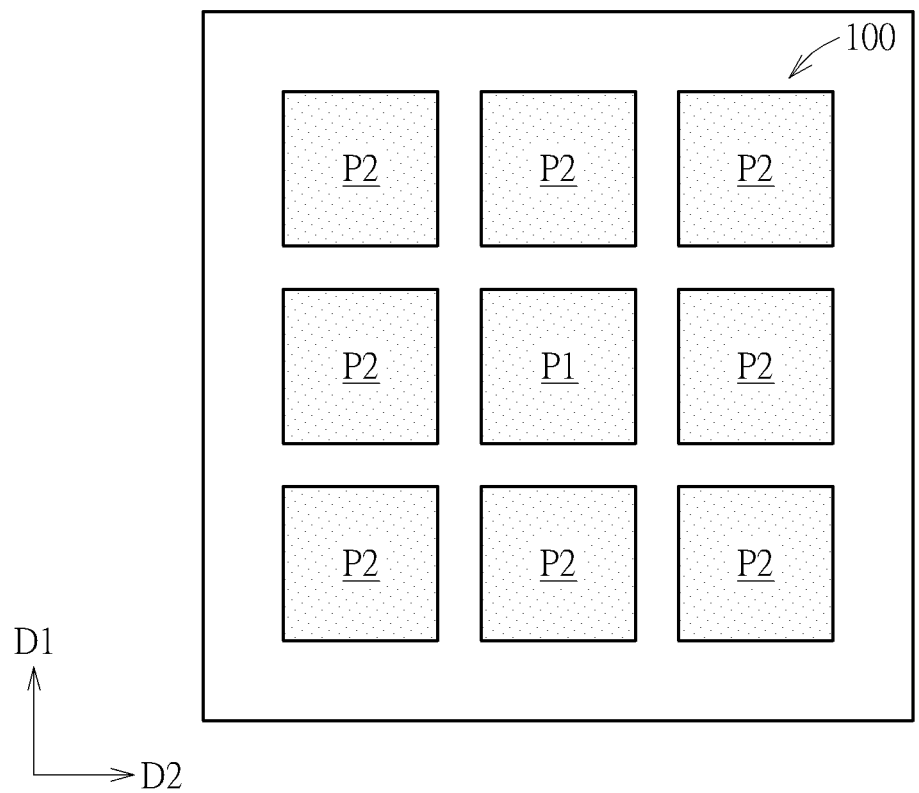
FIG. 2 is a schematic drawing illustrating a layout pattern according to the first embodiment of the present invention.
Figure 3:
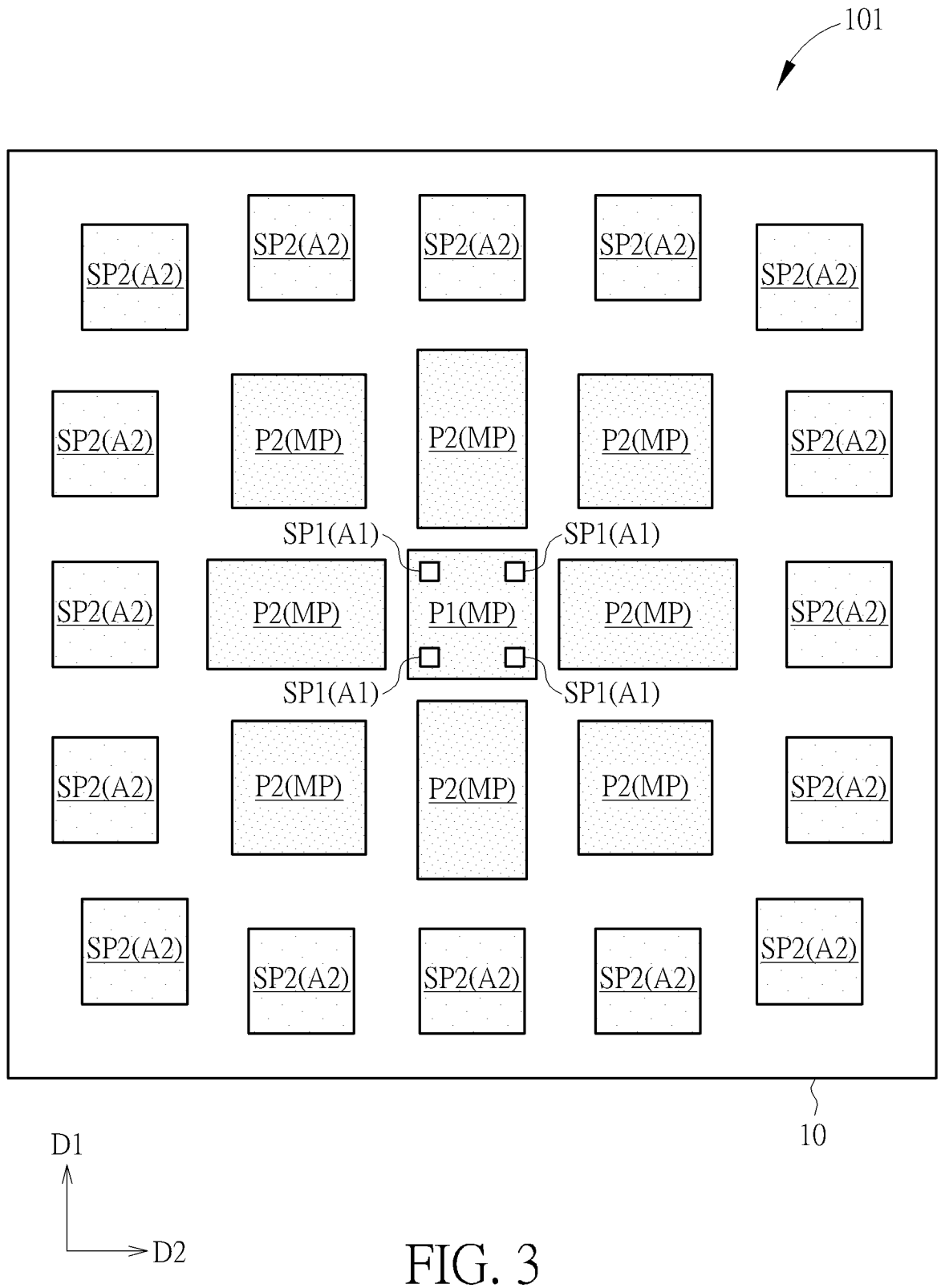
FIG. 3 is a schematic drawing illustrating a mask according to the first embodiment of the present invention.
Figure 4:
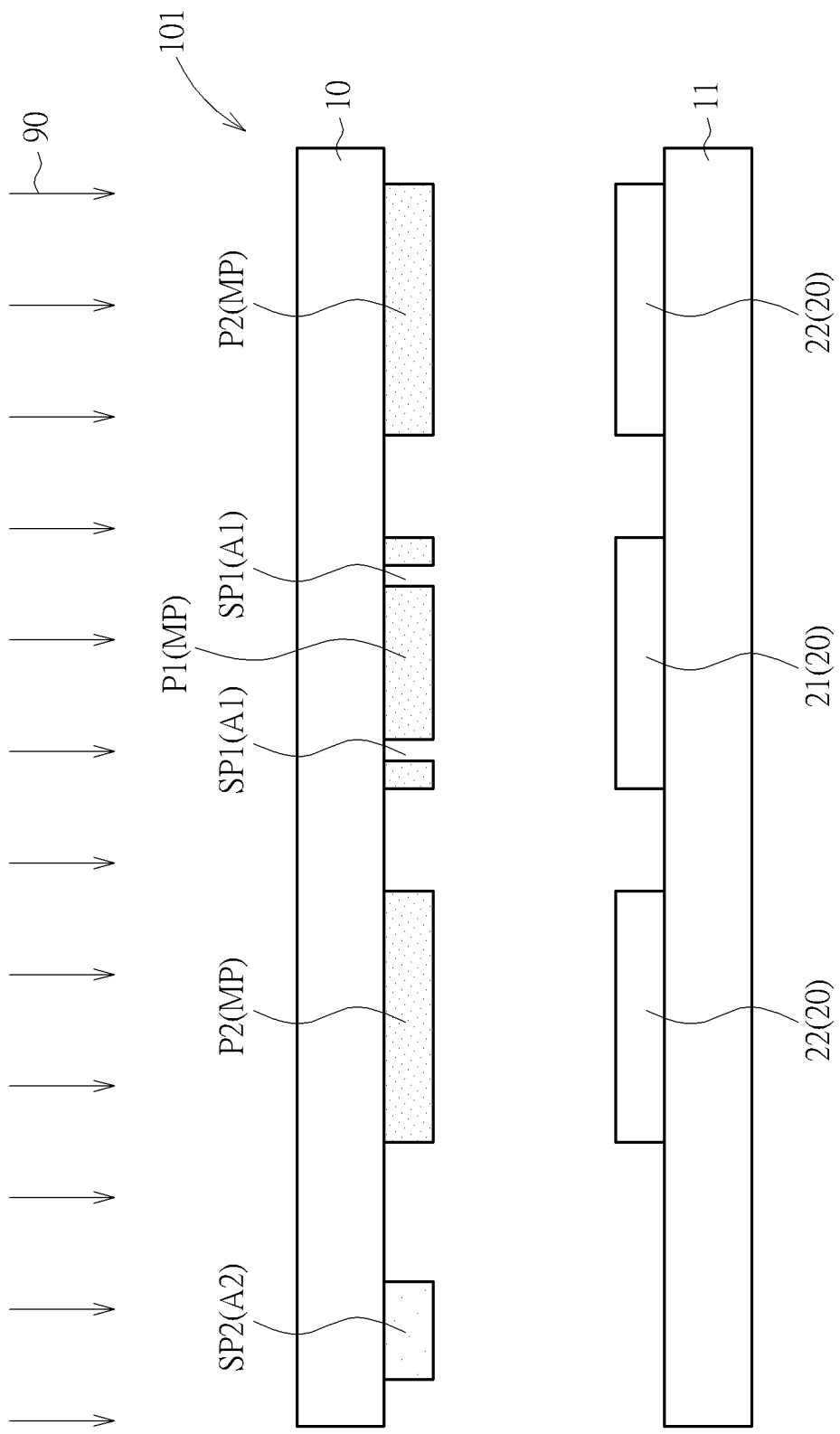
FIG. 4 is a schematic drawing illustrating a photolithography process of the method of forming the pattern according to the first embodiment of the present invention.

Please refer to FIGS. 1-4. FIG. 1 is a flow chart of a method of forming a pattern according to a first embodiment of the present invention. FIG. 2 is a schematic drawing illustrating a layout pattern in this embodiment. FIG. 3 is a schematic drawing illustrating a mask in this embodiment. FIG. 4 is a schematic drawing illustrating a photolithography process of the method of forming the pattern in this embodiment. As shown in FIGS. 1-3, a method of forming a pattern is provided in this embodiment, and the method includes the following steps. Firstly, in step S11, a layout pattern 100 is provided to a computer system. The layout pattern 100 may include a first pattern P1 and a plurality of second patterns P2. The first pattern P1 and the second patterns P2 may be separated from one another. Two of the second patterns P2 are disposed at two opposite sides of the first pattern P1 in a first direction D1. Additionally, in some embodiments, two of the second patterns P2 may be disposed at two opposite sides of the first pattern P1 in a second direction D2 different from the first direction D1, and the second direction D2 may be substantially perpendicular to the first direction D1, but not limited thereto. Additionally, in some embodiments, the second patterns P2 may surround the first pattern P1. For instance, the first pattern P2 and eight second patterns P2 may be arranged in a 3×3 array configuration, but not limited thereto. The first pattern P1 and the second patterns P2 in the layout pattern 100 may correspond to feature patterns in an integrated circuit going to be formed, such as device patterns, line patterns, contact holes, or other island structures or recess structures, but not limited thereto.

Subsequently, in step S12, an optical proximity correction (OPC) is performed to the layout pattern 100. After the optical proximity correction, step S13 is executed to determine whether there is a weak pattern in the layout pattern 100 after the optical proximity correction. Step S14 will be carried out for forming a first assist pattern A1 in the layout pattern 100 when a weak pattern is determined. Comparatively, step S15 will be carried out for outputting the layout pattern 100 through the computer system onto a mask when there is not any weak pattern. Additionally, in some embodiments, after forming the first assist pattern A1 in step S14, step S13 may be carried out again for further determining whether there is a weak pattern or not, and step S15 may be carried out to output the first layout pattern 100 and the first assist pattern A1 to a mask (such as a mask 101 shown in FIG. 3) when there is not any weak pattern. Additionally, in some embodiments, step S15 may be carried out right after forming the first assist pattern A1 in step S14 for outputting the layout pattern and the first assist pattern A1 onto the mask 101.

For example, the first pattern P1 and the second patterns P2 shown in FIG. 3 may be the result of performing the optical proximity correction to the layout pattern 100 shown in FIG. 2, and the first assist pattern A1 is formed in the layout pattern 100 accordingly. Additionally, the method of forming the pattern in this embodiment may further include forming a second assist pattern A2 outside the layout pattern 100, and the second assist pattern A2 may surround the first pattern P1 and the second patterns of the layout pattern 100 and the first assist pattern A1 formed in the layout pattern 100, but not limited thereto. Therefore, in the step S15 described above, the layout pattern, the first assist pattern A1, and the second assist pattern A2 may be outputted onto the mask 101, wherein the first assist pattern A1 is located in the layout pattern 100, and the second assist pattern A2 is located outside the layout pattern 100. It is worth noting that, in some embodiments, the first assist pattern A1 may be directly formed in the layout pattern 100 and the second assist pattern A2 may be directly formed outside the layout pattern 100 without performing the optical proximity correction in the step S12 described above. Additionally, in some embodiments, the optical proximity correction to the layout pattern 100 may be performed before the step forming the first assist pattern A1, the second assist pattern A2 may be formed by the optical proximity correction, and the second assist pattern A2 may be formed before the step of forming the first assist pattern A1 accordingly, but not limited thereto. In some embodiments, the optical proximity correction may be performed after the step of forming the first assist pattern A1 according to some considerations. As shown in FIG. 3, the first pattern P1 surrounded by the second patterns P2 are adjacent to more second patterns P2, and the first pattern P1 may not be effectively transferred to the target layer because the exposure dose at the region corresponding to the first pattern P1 tends to be influenced by the second patterns P2 in the exposure process. In the condition described above, the first pattern P1 may be determined as a weak pattern, and the first assist pattern A1 may be formed in the first pattern P1 or in the second patterns P2 for adjusting the expose dose distribution at the first pattern P1 and the second patterns P2 in the exposure process and obtaining the required exposure result. In addition, the second assist pattern A2 may surround the first pattern P1 and the second patterns P2 for adjusting the expose dose distribution at the outer sides of the second patterns P2 in the exposure process. Therefore, the dimension of the first assist pattern A1 may be different from the dimension of the second assist pattern A2, but not limited thereto. In some embodiments, the dimension of the first assist pattern A1 may be close to the dimension of the second assist pattern A2 according to some considerations.

In this embodiment, the mask 101 may include a first substrate 10, a main pattern MP, the first assist pattern A1, and the second assist pattern A2. The first substrate 10 may include a transparent substrate, such as a quartz substrate, a glass substrate, a plastic substrate, a ceramic substrate, or substrates formed by other suitable materials. The main pattern MP is disposed on the first substrate 10, and the main pattern MP includes the first pattern P1 and second patterns P2. Two of the second patterns P2 are disposed at two opposite sides of the first pattern P1 in the first direction D1. Additionally, in some embodiments, two of the second patterns P2 may be disposed at two opposite sides of the first pattern P1 in the second direction D2 different from the first direction D1, and the second patterns P2 may surround the first pattern P1. For instance, the first pattern P2 and eight second patterns P2 may be arranged in a 3×3 array configuration, but not limited thereto. The first assist pattern A1 is disposed on the first substrate 10 and disposed in the main pattern MP, and the second assist pattern A2 is disposed on the first substrate 10 and disposed outside the main pattern MP. Specifically, in some embodiments, the first assist pattern A1 may be disposed in the first pattern P1 or disposed in the second patterns P2 disposed at the two opposite sides of the first pattern P1 in the first direction D1. In some embodiments, the first assist pattern A1 may be disposed in the first pattern P1 or disposed in the second patterns P2 disposed at the two opposite sides of the first pattern P1 in the second direction D2. In some embodiments, the first assist pattern A1 may be disposed in the first pattern P1 or disposed in the second patterns P2 surrounding the first pattern P1. In other words, the first assist pattern A1 may be disposed in the first pattern P1 or disposed in at least apart of the second patterns P2 adjacent to the first pattern P1.

Additionally, the first assist pattern A1 may include a plurality of first sub patterns SP1 separated from one another, and the second assist pattern A2 may include a plurality of second sub patterns SP2 separated from one another and surrounding the main pattern MP, but not limited thereto. Each of the first sub patterns SP1 may be disposed in the first pattern P1 at a side of the first pattern P1 close to the adjacent second pattern P2 or be disposed in the second pattern P2 at a side of the second pattern P2 close to the first pattern P1. The first sub patterns SP1 may be disposed at corner regions of the first pattern P1 or be disposed at corner regions of the second patterns P2, but not limited thereto. For example, when the first pattern P1 is a rectangle, the first assist pattern A1 may include four first sub patterns SP disposed at four corner regions of the first pattern P1 respectively. In some embodiments, the dimension of each of the first sub patterns SP1 may be different from the dimension of each of the second sub patterns SP2, but not limited thereto. It is worth noting that the shapes of the first pattern P1, the second patterns P2, the first sub patterns SP1, and the second sub patterns SP2 are not limited to the condition shown in FIG. 3 and may be further modified according to design considerations. Additionally, in some embodiments, the first pattern P1, the second patterns P2, and the second assist pattern A2 may be light-shielding patterns, and the first assist pattern A1 may be a light-transmitting pattern. In other embodiments, the first pattern P1, the second patterns P2, and the second assist pattern A2 may be light-transmitting patterns, and the first assist pattern A1 may be a light-shielding pattern. In other words, the light-transmitting property or the light-shielding property of the first pattern P1 may be substantially the same as the light-transmitting property or the light-shielding property of the second pattern P2 and the light-transmitting property or the light-shielding property of the second assist pattern A2. The light-transmitting property or the light-shielding property of the first assist pattern A1 may be different from that of the first pattern P1, the second pattern P2, and the second assist pattern A2. The light-shielding pattern described above may include light-absorbing material, light-blocking material or other materials capable of altering the light transmittance and/or the light path of the exposure light source used in the exposure process required for the mask 101. For example, opaque materials such as chromium or resin or translucent materials such as molybdenum silicide may be used to form the light-shielding pattern described above, but not limited thereto. Additionally, in some embodiments, the light-transmitting pattern described above may be fully pervious to light or partially pervious to light.

As shown in FIG. 3 and FIG. 4, the method of forming the pattern in this embodiment may further include transferring the layout pattern from the mask 101 to a material layer 20 through a photolithography process 90 with the mask 101. In some embodiments, the material layer 20 may include a photoresist layer or other photo-patternable materials, and the material layer may be disposed on a second substrate 11, but not limited thereto. The second substrate 11 may include a semiconductor substrate or other suitable substrates. In some embodiments, when the first pattern P1, the second patterns P2, and the second assist pattern A2 are light-shielding patterns and the first assist pattern A1 is a light-transmitting pattern, the material layer 20 may be a positive photoresist for performing the photolithography process 90 and forming a first patterned structure 21 and a second patterned structure 22 on the second substrate 11, wherein the first patterned structure 21 is formed corresponding to the first pattern P1 and the second patterned structure 22 is formed corresponding to the second patterns P2, but the present invention is not limited thereto. In some embodiments, the material layer 20 may be a positive photoresist or a negative photoresist depending on the light-transmitting property or the light-shielding property of the first pattern P1 and the second patterns P2 and whether the structure going to be formed is an island structure or a recess structure. It is worth noting that the first assist pattern A1 and the second assist pattern A2 are not transferred to the material layer 20 after the photolithography process 90, and the first assist pattern A1 and the second assist pattern A2 are only used to modify the exposure dose distribution in the exposure process for obtaining the first patterned structure 21 and the second patterned structure 22 more close to the design in the original layout pattern. In other words, the first pattern P1 and the second patterns P2 may be printable patterns, and the first assist pattern A1 and the second assist pattern A2 may be non-printable patterns.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 5:
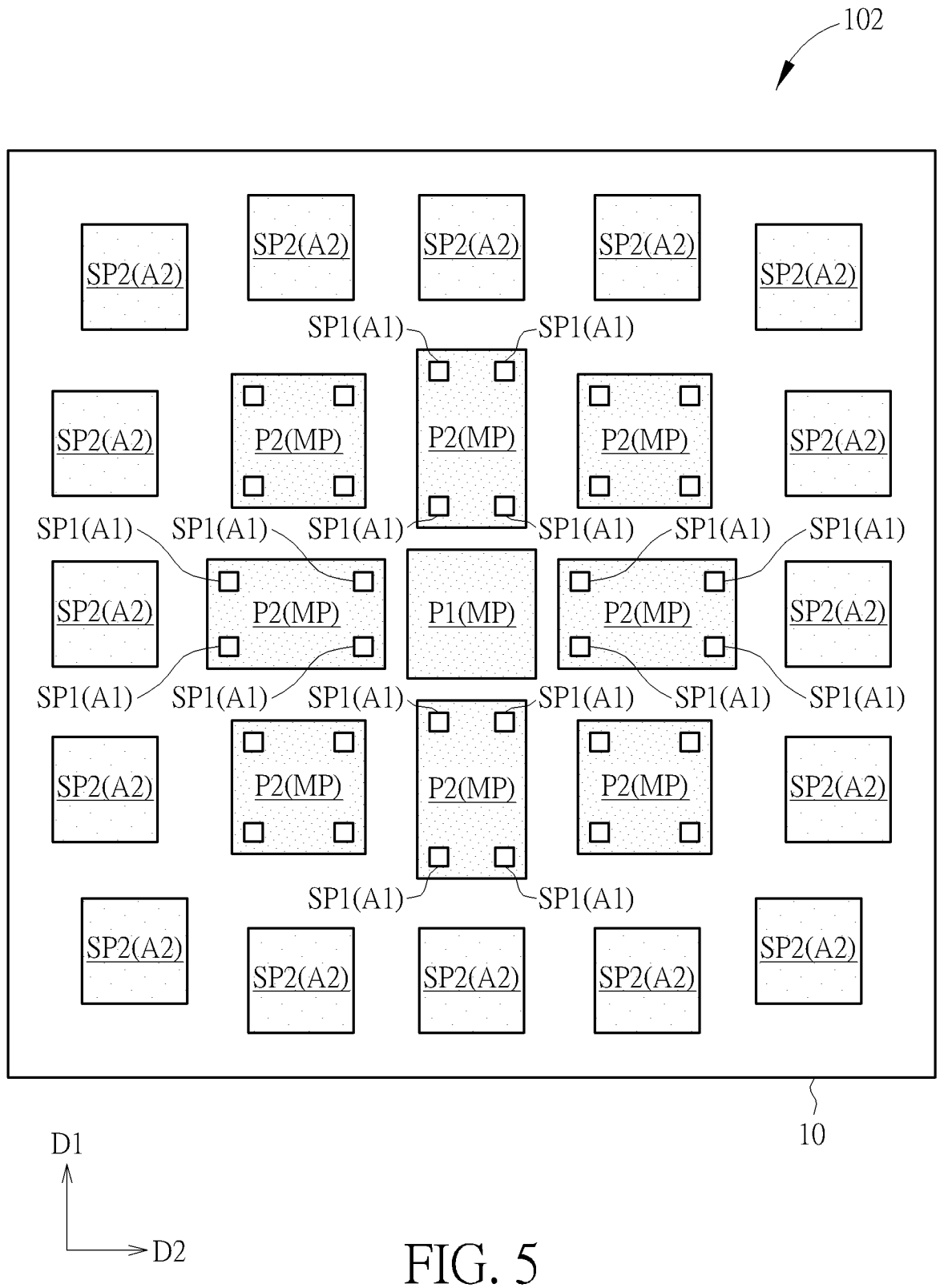
FIG. 5 is a schematic drawing illustrating a mask according to a second embodiment of the present invention.

Please refer to FIG. 5. FIG. 5 is a schematic drawing illustrating a mask 102 according to a second embodiment of the present invention. As shown in FIG. 5, the difference between this embodiment and the first embodiment described above is that the first assist pattern A1 may be disposed in the second patterns P2 without being disposed in the first pattern A1. In other words, in the method of forming the pattern in this embodiment, the first assist pattern A1 may be formed in the second patterns P2 disposed at the two opposite sides of the first pattern P1 in the first direction D1 and/or be formed in the second patterns P2 disposed at the two opposite sides of the first pattern P1 in the second direction D2. Additionally, the first assist pattern A1 may be formed in the eight second patterns P2 surrounding the first pattern P1. In some embodiments, the first assist pattern A1 may include the first sub patterns SP1 respectively disposed at the corner regions of each of the second patterns P2, but not limited thereto.

Figure 6:
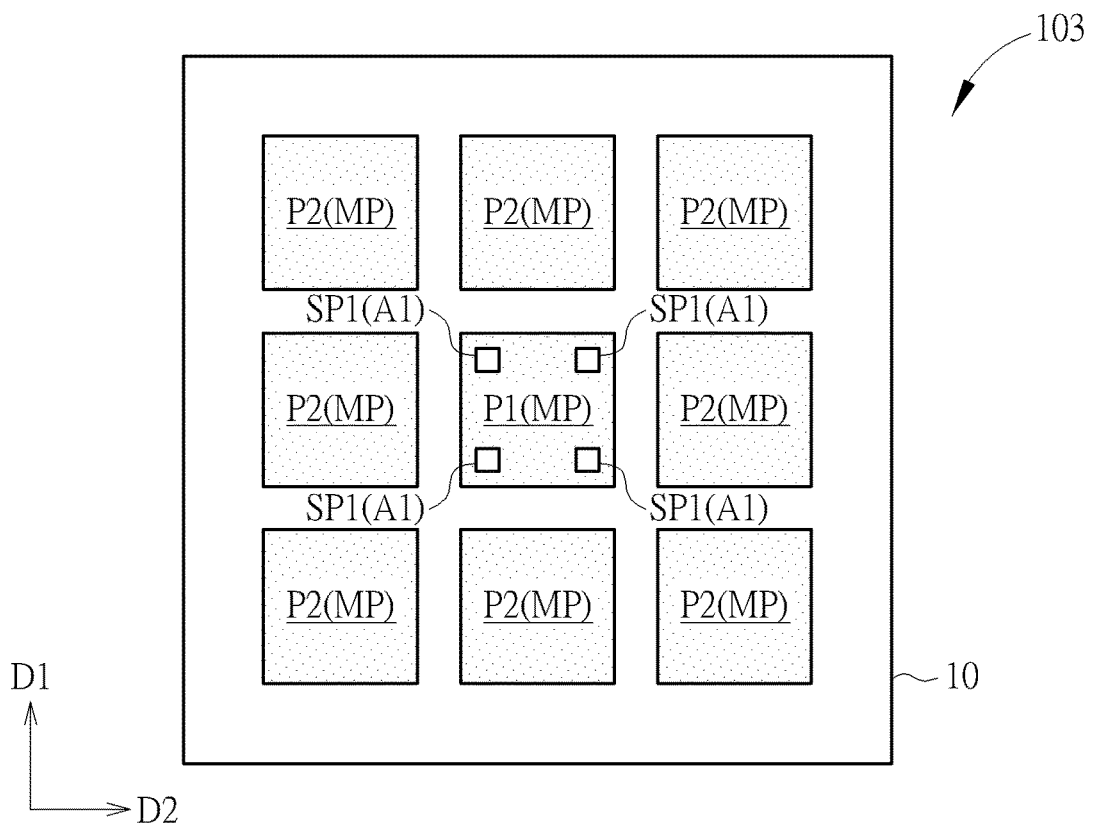
FIG. 6 is a schematic drawing illustrating a mask according to a third embodiment of the present invention.

Please refer to FIG. 6. FIG. 6 is a schematic drawing illustrating a mask 103 according to a third embodiment of the present invention. As shown in FIG. 6, the mask 103 includes the first substrate 10, the main pattern MP, and an assist pattern (i.e. the first assist pattern A1). The main pattern MP is disposed on the first substrate 10, and the main pattern MP includes the first pattern P1 and the second patterns P2. The first pattern P1 and the second patterns P2 are arranged in an array configuration, and the second patterns P2 surround the first pattern P1. In this embodiment, the main pattern MP may include one first pattern P1 and eight second patterns P2 arranged in a 3×3 array configuration, but not limited thereto. In some embodiments, the first pattern P1 and the second patterns P2 may also be arranged in other kinds of array configurations. The first assist pattern A1 is disposed on the first substrate 10. The first assist pattern A1 may include a plurality of the first sub patterns SP1 disposed in the first pattern P1, but not limited thereto. In some embodiments, the first sub patterns SP1 of the first assist pattern A1 may also be disposed in the second patterns P2 without being disposed in the first pattern P1. In addition, the difference between this embodiment and the first embodiment described above is that the mask 103 in this embodiment may not include the second assist pattern described in the first embodiment, and only the first assist pattern A1 is used to modify the exposure dose distribution in the exposure process using the mask 103.

Figure 7:
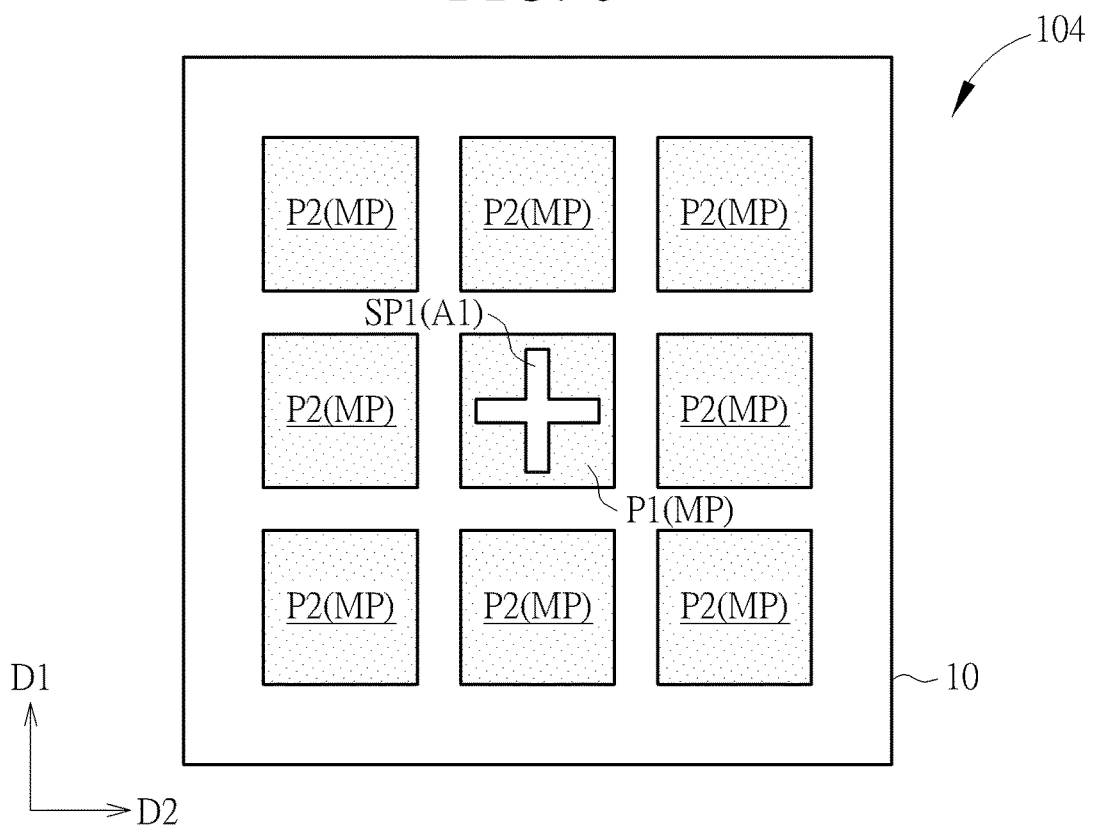
FIG. 7 is a schematic drawing illustrating a mask according to a fourth embodiment of the present invention.
Figure 8:
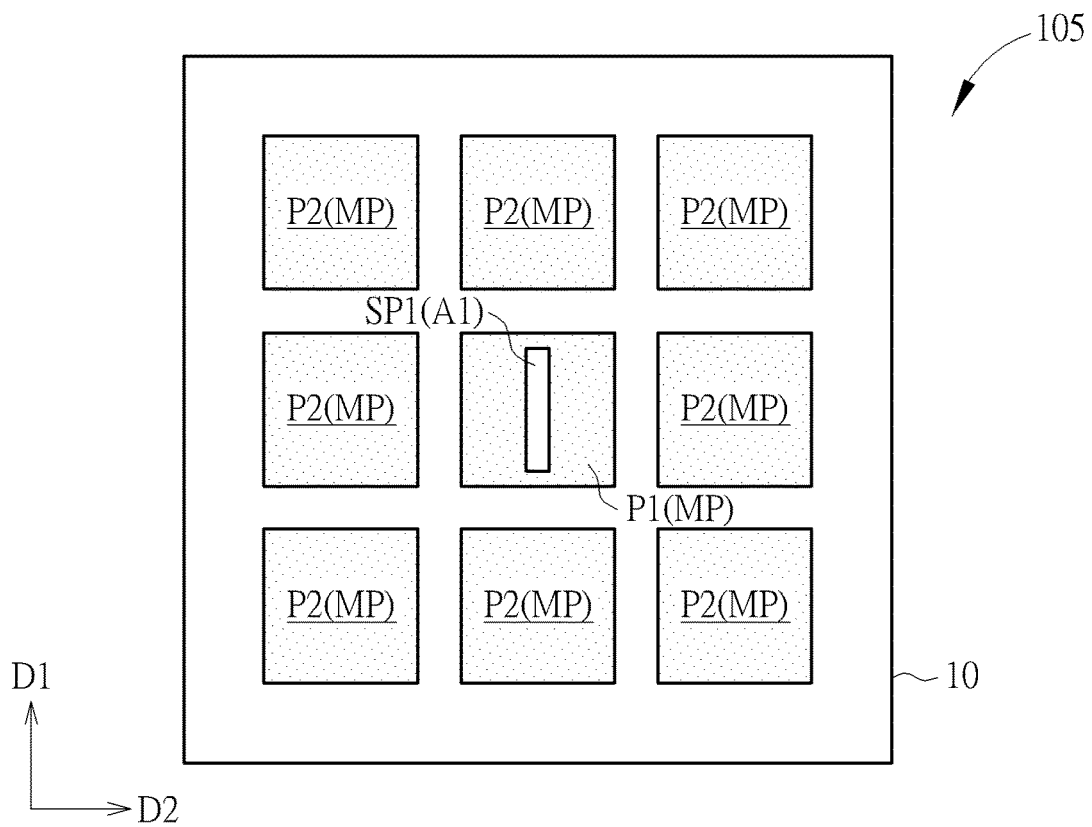
FIG. 8 is a schematic drawing illustrating a mask according to a fifth embodiment of the present invention.

Please refer to FIG. 7 and FIG. 8. FIG. 7 is a schematic drawing illustrating a mask 104 according to a fourth embodiment of the present invention. FIG. 8 is a schematic drawing illustrating a mask 105 according to a fifth embodiment of the present invention. As shown in FIG. 7 and FIG. 8, the difference between these embodiments and the third embodiment described above is that the first assist pattern A1 in the mask 104 may include a cross pattern, and the first assist pattern A1 in the mask 105 may include a slot pattern. Additionally, the second assist pattern surrounding the main pattern MP in the above-mentioned first embodiment may also be disposed in the mask 104 and the mask 105 according to some considerations.

Figure 9:
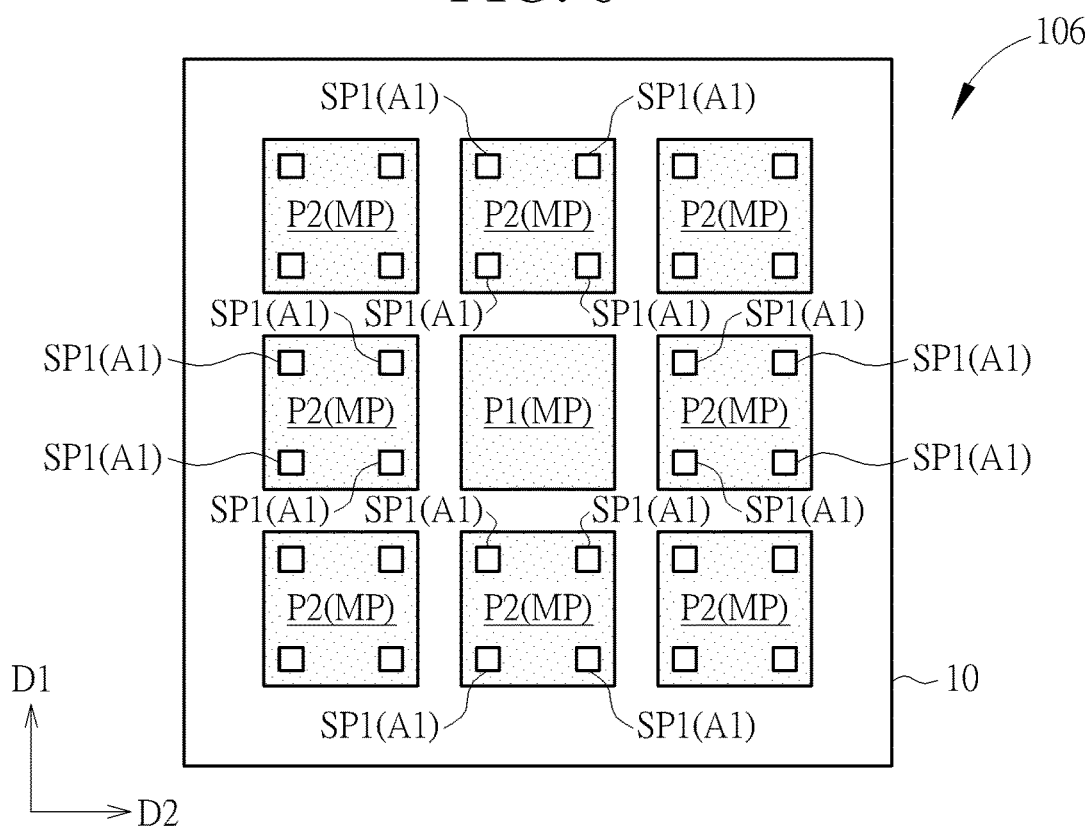
FIG. 9 is a schematic drawing illustrating a mask according to a sixth embodiment of the present invention.

Please refer to FIG. 9. FIG. 9 is a schematic drawing illustrating a mask 106 according to a sixth embodiment of the present invention. As shown in FIG. 9, the difference between this embodiment and the third embodiment described above is that the first assist pattern A1 in this embodiment may be disposed in the second patterns P2 without being disposed in the first pattern P1. The first assist pattern A1 may be disposed in the second patterns P2 surrounding the first pattern P1, and the first assist pattern A1 may include a plurality of the first sub patterns SP1 respectively disposed at the corner regions of each of the second patterns P2, but not limited thereto.

Figure 10:
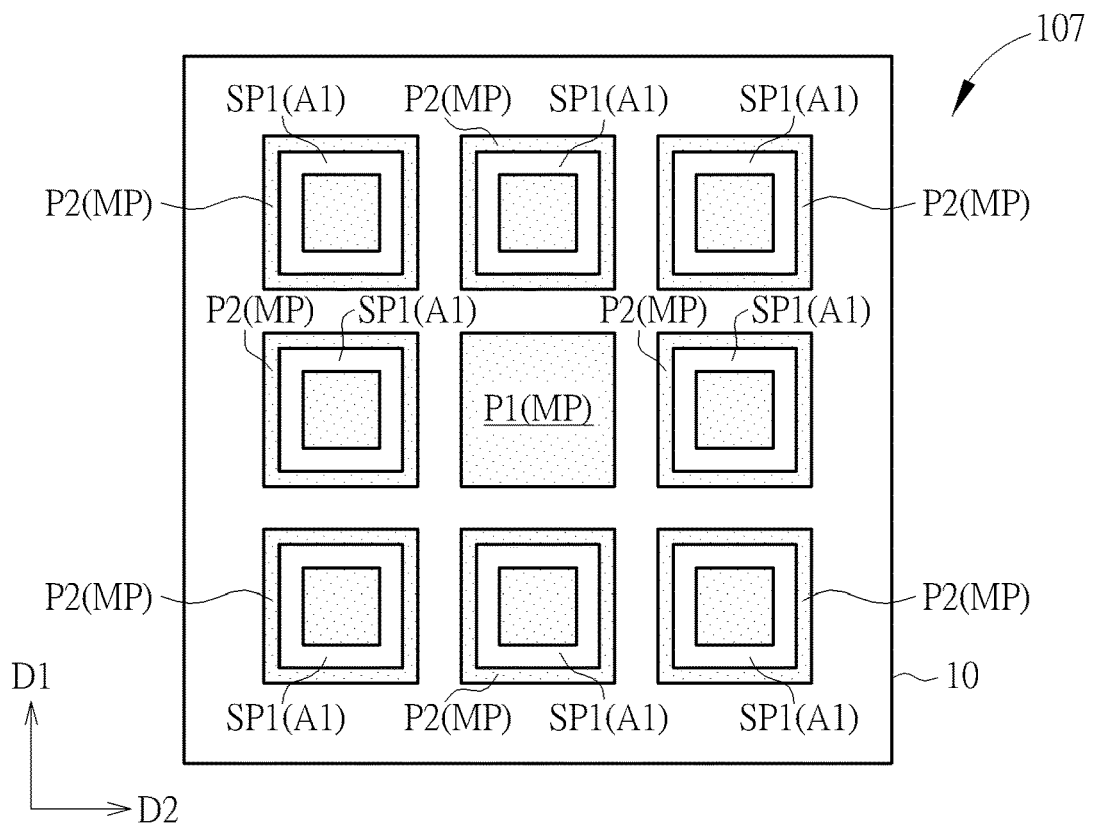
FIG. 10 is a schematic drawing illustrating a mask according to a seventh embodiment of the present invention.

Please refer to FIG. 10. FIG. 10 is a schematic drawing illustrating a mask 107 according to a seventh embodiment of the present invention. As shown in FIG. 10, the difference between this embodiment and the sixth embodiment described above is that the first assist pattern A1 in this embodiment may include a plurality of the first sub patterns SP1 which are ring patterns respectively disposed in the second patterns P2, and there may be only one first sub pattern SP1 disposed in each of the second pattern P2. Additionally, the second assist pattern surrounding the main pattern MP in the above-mentioned first embodiment may also be disposed in the mask 107 according to some considerations.

Figure 11:
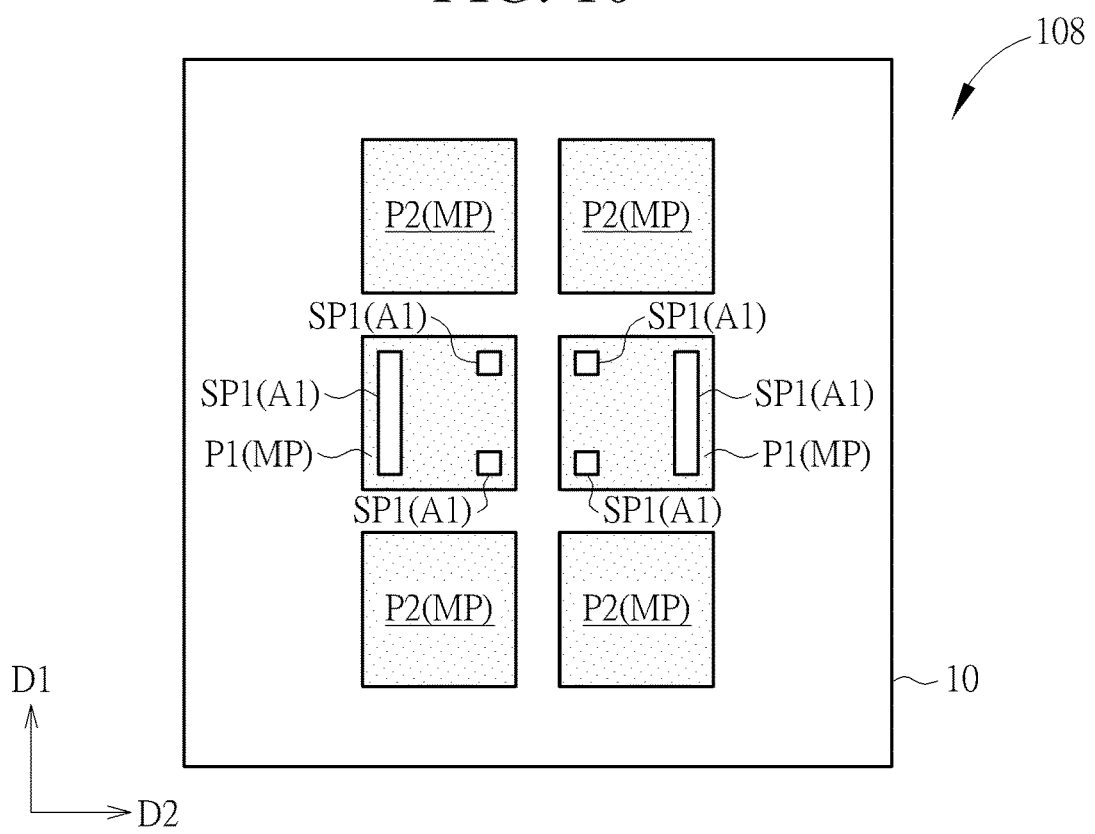
FIG. 11 is a schematic drawing illustrating a mask according to an eighth embodiment of the present invention.

Please refer to FIG. 11. FIG. 11 is a schematic drawing illustrating a mask 108 according to an eighth embodiment of the present invention. As shown in FIG. 11, the difference between this embodiment and the third embodiment described above is that the main pattern MP in this embodiment may include two first patterns P1 and four second patterns P2 arranged in a 2×3 array configuration. The first sub patterns SP1 of the first assist pattern A1 disposed in the first patterns P1 may have different shapes. For example, the first sub patterns SP1 may include slot sub patterns and block sub patterns, but not limited thereto. Additionally, the second assist pattern surrounding the main pattern MP in the above-mentioned first embodiment may also be disposed in the mask 108 according to some considerations.

Figure 12:
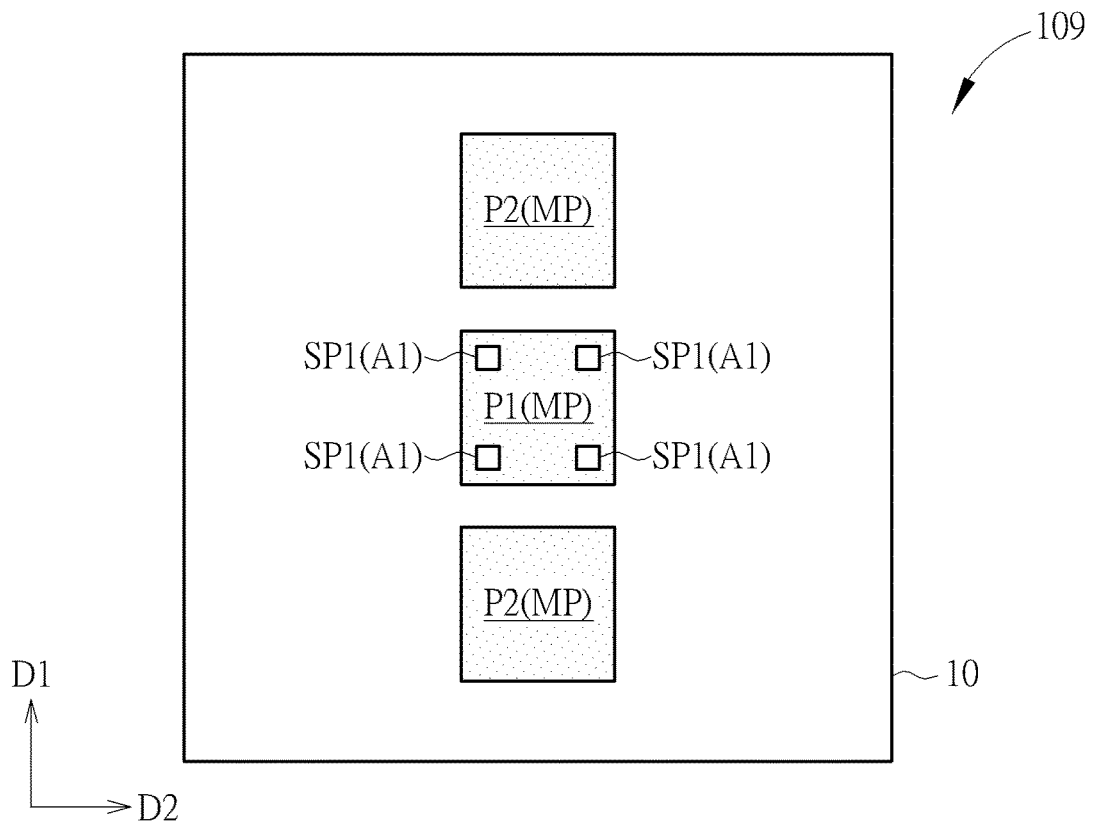
FIG. 12 is a schematic drawing illustrating a mask according to a ninth embodiment of the present invention.
Figure 13:
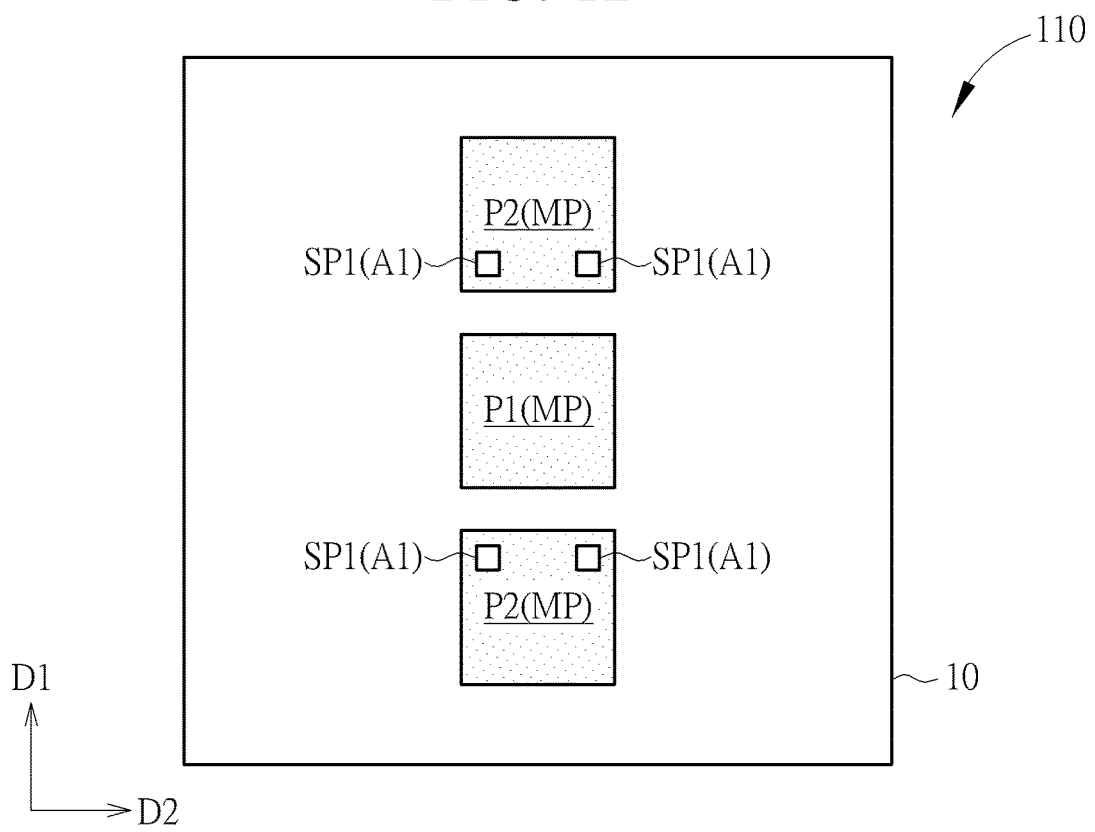
FIG. 13 is a schematic drawing illustrating a mask according to a tenth embodiment of the present invention.
Figure 14:
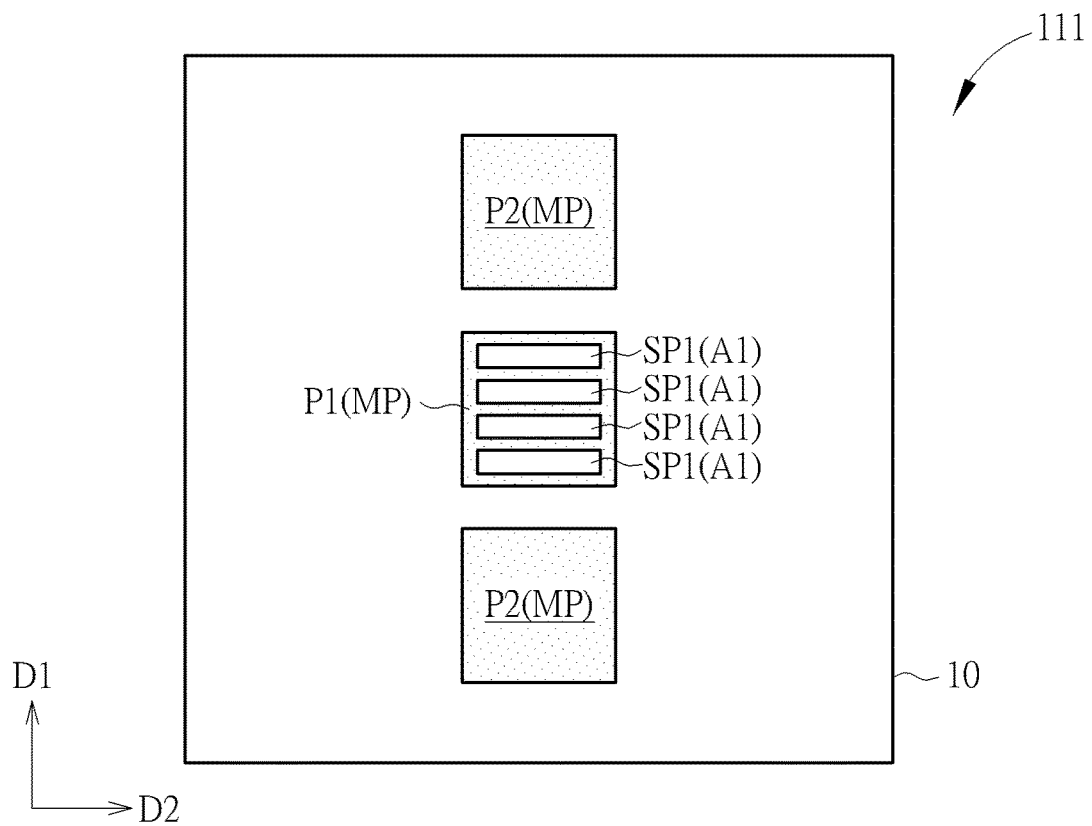
FIG. 14 is a schematic drawing illustrating a mask according to an eleventh embodiment of the present invention.
Figure 15:
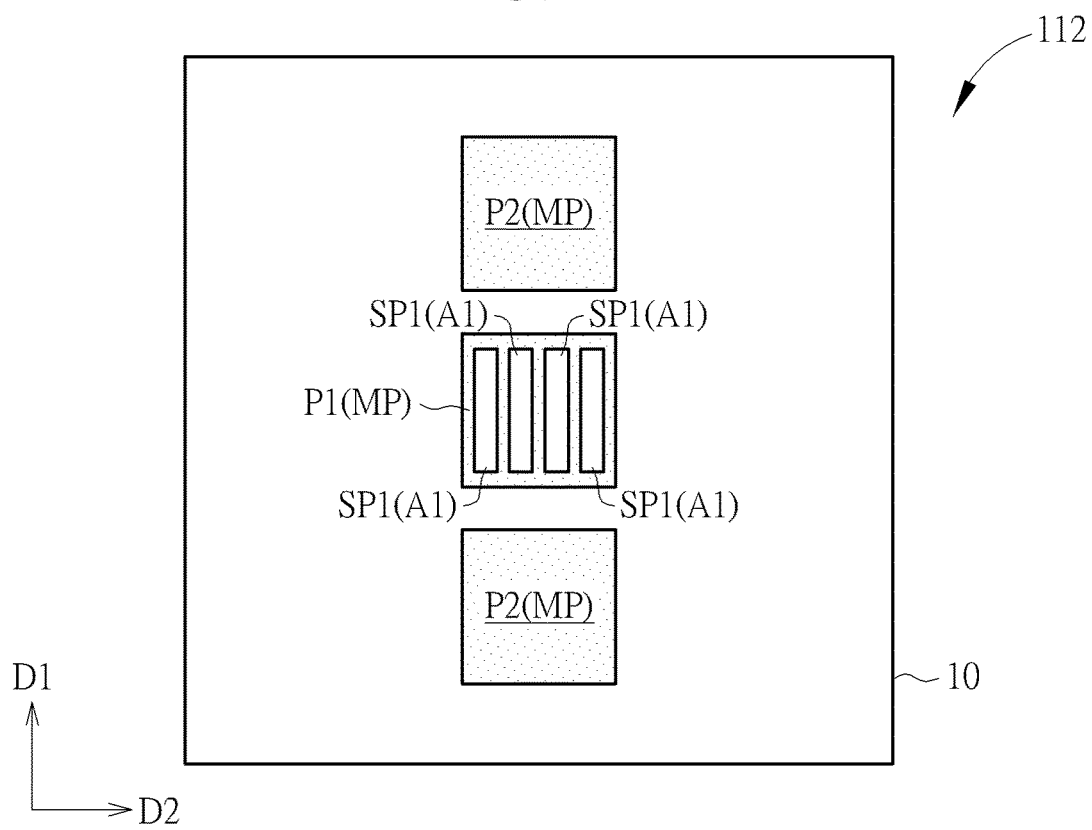
FIG. 15 is a schematic drawing illustrating a mask according to a twelfth embodiment of the present invention.

Please refer to FIGS. 12-15. FIG. 12 is a schematic drawing illustrating a mask 109 according to a ninth embodiment of the present invention. FIG. 13 is a schematic drawing illustrating a mask 110 according to a tenth embodiment of the present invention. FIG. 14 is a schematic drawing illustrating a mask 111 according to an eleventh embodiment of the present invention. FIG. 15 is a schematic drawing illustrating a mask 112 according to a twelfth embodiment of the present invention. As shown in FIGS. 12-15, the difference between these embodiments and the third embodiment described above is that the mask 109, the mask 110, the mask 111, and the mask 112 may include one first pattern P1 and two second patterns P2 only, and the two second patterns P2 are disposed at two opposite sides of the first pattern P1 in the first direction D1 respectively. Additionally, the first assist pattern A1 may include a plurality of the first sub patterns SP1 disposed at the corner regions of the first pattern P1 or disposed at the corner regions of the two second patterns P2. For instance, as shown in FIG. 13, the first sub patterns SP1 may be disposed at the corner regions of each of the second patterns P2 and only disposed at the corner regions close to the first pattern P1. In addition, as shown in FIG. 14 and FIG. 15, each of the first sub patterns SP1 may include a slot pattern extending in the first direction D1 or extending in the second direction D2. Additionally, the second assist pattern surrounding the main pattern MP in the above-mentioned first embodiment may also be disposed in the mask 109, the mask 110, the mask 111, and the mask 112 according to some considerations.

Figure 16:
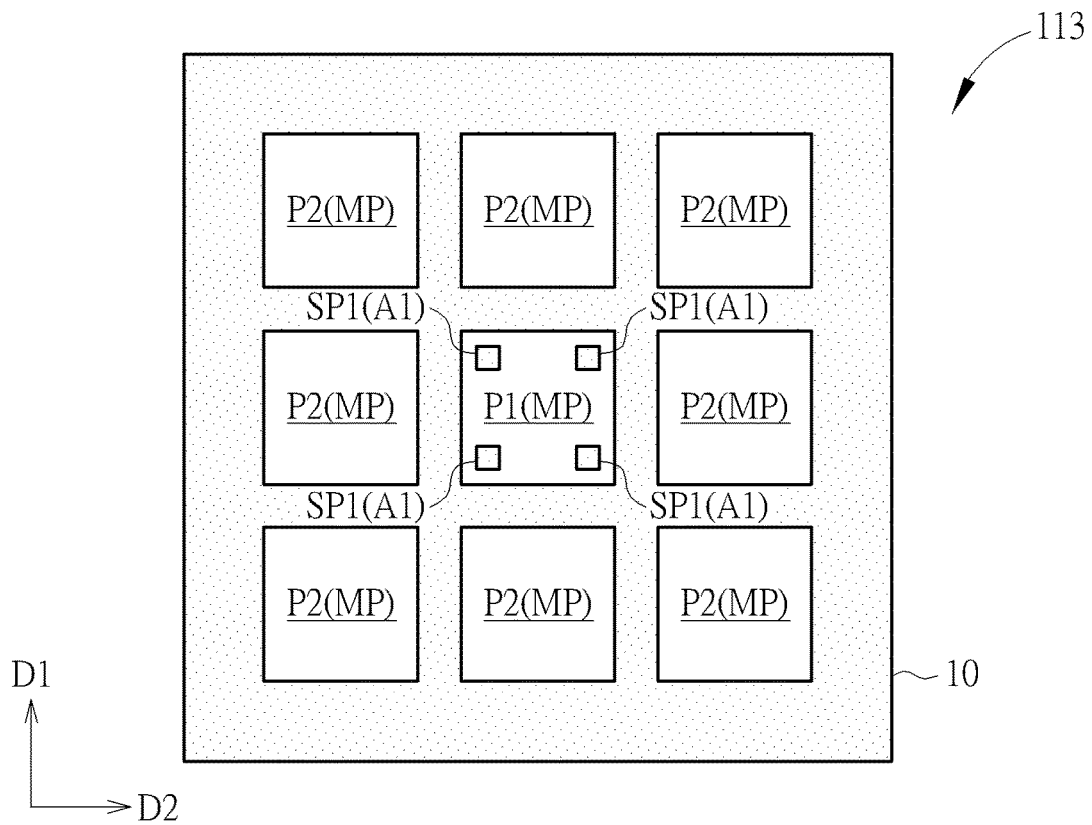
FIG. 16 is a schematic drawing illustrating a mask according to a thirteenth embodiment of the present invention.
Figure 17:
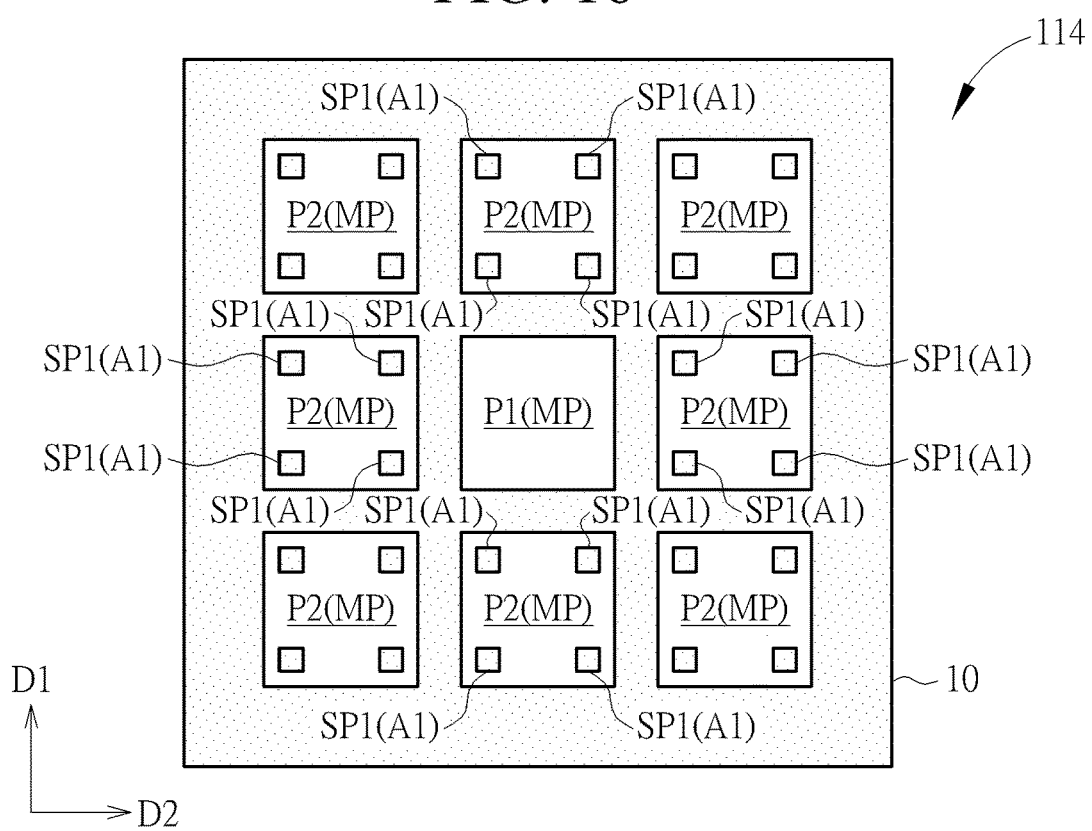
FIG. 17 is a schematic drawing illustrating a mask according to a fourteenth embodiment of the present invention.

Please refer to FIG. 16 and FIG. 17. FIG. 16 is a schematic drawing illustrating a mask 113 according to a thirteenth embodiment of the present invention. FIG. 17 is a schematic drawing illustrating a mask 114 according to a fourteenth embodiment of the present invention. As shown in FIG. 16 and FIG. 17, the difference between these embodiments, the third embodiment and the sixth embodiment described above is that, in the mask 113 and the mask 114, the first pattern P1 and the second patterns P2 may be light-transmitting patterns, and the first assist pattern A1 may be a light-shielding pattern. The mask 113 and the mask 114 may be used with a positive photoresist for forming recess patterned structures such as contact holes, but not limited thereto. Additionally, the second assist pattern surrounding the main pattern MP in the above-mentioned first embodiment may also be disposed in the mask 113 and the mask 114 according to some considerations.

To summarize the above descriptions, in the mask and the method of forming the pattern adoring to the present invention, the first assist pattern may be disposed in the first pattern of the main pattern or disposed in the second patterns adjacent to the first pattern for improving the pattern transferring performance of the first pattern and the second patterns in the exposure process. In addition, the second assist pattern may be disposed outside the main pattern for modifying the expose dose distribution at the outer sides of the second patterns in the exposure process, and the pattern transferring performance of the mask in the photolithography process may be further improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A mask, comprising:
a substrate;
a main pattern disposed on the substrate, wherein the main pattern comprises:
 a first pattern; and
 second patterns, wherein two of the second patterns are disposed at two opposite sides of the first pattern in a first direction;
a first assist pattern disposed on the substrate and disposed in the main pattern, wherein the first assist pattern is disposed within the first pattern completely, the first assist pattern comprises first sub patterns separated from one another, and the first sub patterns are disposed at corner regions of the first pattern; and
a second assist pattern disposed on the substrate and disposed outside the main pattern.

2. The mask of claim 1, wherein the second assist pattern comprises second sub patterns surrounding the main pattern.

3. The mask of claim 1, wherein the first pattern, the second patterns, and the second assist pattern are light-shielding patterns, and the first assist pattern is a light-transmitting pattern.

4. The mask of claim 1, wherein the first pattern, the second patterns, and the second assist pattern are light-transmitting patterns, and the first assist pattern is a light-shielding pattern.

5. The mask of claim 1, wherein at least one of the first sub patterns comprises a slot pattern.

6. The mask of claim 1, wherein the dimension of the first assist pattern is different from the dimension of the second assist pattern.

7. A mask, comprising:
   a substrate;
   a main pattern disposed on the substrate, wherein the main pattern comprises:
      a first pattern; and
      second patterns, wherein the first pattern and the second patterns are arranged in an array configuration, and the second patterns surround the first pattern; and
   an assist pattern disposed on the substrate, wherein the assist pattern comprises sub patterns disposed within the first pattern completely, and the sub patterns are disposed at corner regions of the first pattern.

8. The mask of claim 7, wherein the first pattern and the second patterns are light-shielding patterns, and the assist pattern is a light-transmitting pattern.

9. The mask of claim 7, wherein the first pattern and the second patterns are light-transmitting patterns, and the assist pattern is a light-shielding pattern.

10. The mask of claim 7, wherein at least one of the sub patterns comprises a slot pattern.

11. A method of forming a pattern, comprising:
    providing a layout pattern to a computer system, wherein the layout pattern comprises a first pattern and second patterns, and two of the second patterns are disposed at two opposite sides of the first pattern in a first direction;
    forming a first assist pattern in the layout pattern, wherein the first assist pattern is formed within the first pattern completely, and the first assist pattern comprises sub patterns separated from one another and formed at corner regions of the first pattern;
    forming a second assist pattern outside the layout pattern; and
    outputting the layout pattern, the first assist pattern, and the second assist pattern through the computer system onto a mask, wherein the first assist pattern is located in the layout pattern, and the second assist pattern is located outside the layout pattern.

12. The method of forming the pattern according to claim 11, further comprising:
    transferring the layout pattern from the mask to a material layer through a photolithography process with the mask, wherein the first assist pattern and the second assist pattern are not transferred to the material layer.

13. The method of forming the pattern according to claim 11, further comprising:
    performing an optical proximity correction (OPC) to the layout pattern before the step of forming the first assist pattern.

14. The method of forming the pattern according to claim 11, wherein the second patterns surround the first pattern.

15. The method of forming the pattern according to claim 11, wherein the second assist pattern is formed before the step of forming the first assist pattern.

16. The method of forming the pattern according to claim 11, wherein the dimension of the first assist pattern is different from the dimension of the second assist pattern.

* * * * *